United States Patent [19]

O'Malley

[11] 4,286,688

[45] Sep. 1, 1981

[54] LOUDSPEAKER APPARATUS

[76] Inventor: Arthur L. O'Malley, 26 Grove St., Oneonta, N.Y. 13820

[21] Appl. No.: 99,188

[22] Filed: Nov. 30, 1979

Related U.S. Application Data

[63] Continuation of Ser. No. 904,147, May 9, 1978, abandoned.

[51] Int. Cl.[3] .............................................. H05K 5/00

[52] U.S. Cl. .................................... 181/156; 181/163; 181/199; 181/DIG. 1

[58] Field of Search ............... 181/156, 163, 148, 152, 181/144, 150, 199, DIG. 1; 179/1 E,

[56] References Cited

U.S. PATENT DOCUMENTS

| | | | |
|---|---|---|---|
| 1,791,173 | 2/1931 | Thoringten | 181/144 |
| 2,206,012 | 7/1940 | Hart | 181/156 |
| 2,491,982 | 12/1949 | Kincart | 181/156 |
| 2,713,396 | 7/1955 | Tavares | 181/163 |
| 2,971,598 | 2/1961 | Sieler | 181/152 |
| 3,203,502 | 8/1965 | Rije | 181/156 |
| 3,235,028 | 2/1966 | Quinion | 181/154 |
| 3,772,466 | 11/1973 | Hossbach | 181/163 |
| 4,146,744 | 3/1979 | Veranth | 181/146 |

FOREIGN PATENT DOCUMENTS

| | | | |
|---|---|---|---|
| 1527032 | 4/1968 | France | 179/1 E |

*Primary Examiner*—L. T. Hix
*Assistant Examiner*—Benjamin R. Fuller
*Attorney, Agent, or Firm*—Ladas & Parry

[57] ABSTRACT

A loudspeaker apparatus comprises an enclosure having a loudspeaker mounted on a surface thereof, means within the enclosure and cooperating with other surfaces thereof for initially directing sound energy emanating from the back of the loudspeaker through a first sound wave compression zone in a first direction and then substantially equally into each of two second sound wave compression zones in respective second directions opposed to the first direction, and means in each of the second compression zones for propagating the sound energy received thereby out of the enclosure, the propagating means either comprising a passive radiator mounted on a corresponding enclosure surface partially defining each of the second compression zones or comprising ports which face in a direction parallel to that in which the loudspeaker faces and which place each second compression zone into open communication with the outside of the enclosure.

12 Claims, 12 Drawing Figures

FIG. 3
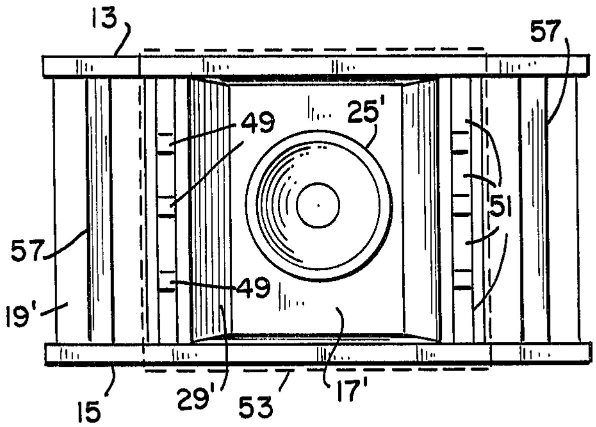
FIG. 5
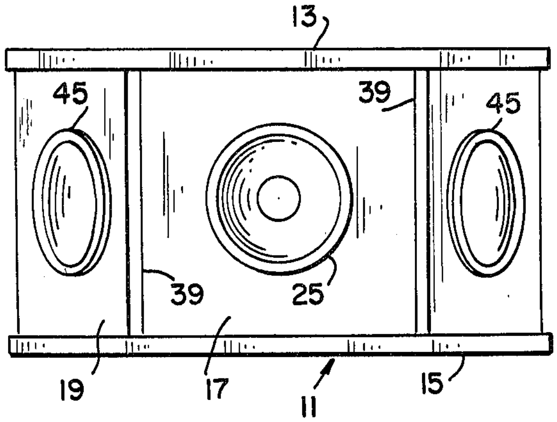
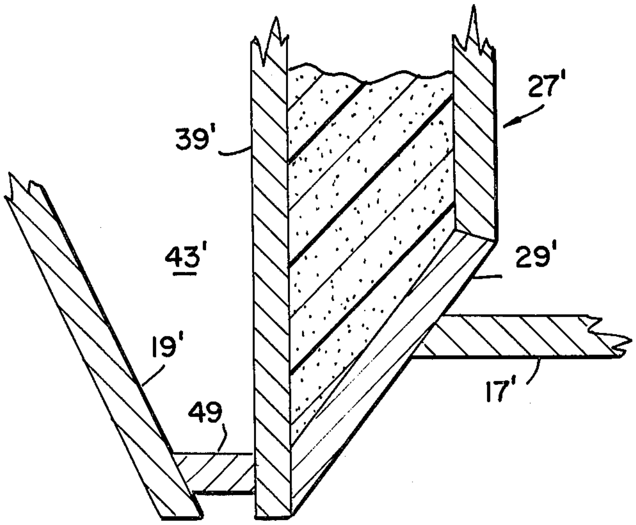
FIG. 4
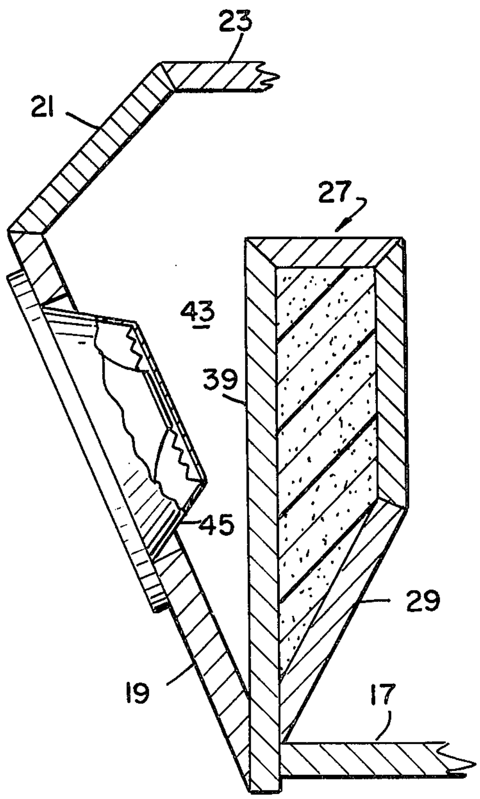
FIG. 6

LOUDSPEAKER APPARATUS

This is a continuation, of application Ser. No. 904,147 filed May 9, 1978 now abandoned.

BACKGROUND OF THE INVENTION

The present invention relates to loudspeaker apparatus. More particularly, it relates to a loudspeaker apparatus of the kind having a speaker enclosure in which propagation out of the enclosure of the forwardly travelling sound energy of the loudspeaker is directly from the front of the loudspeaker, while propagation out of the enclosure of the backwardly travelling sound energy of the loudspeaker is by way of acoustic coupling means from the back of the loudspeaker.

Heretofore, the backwardly travelling sound energy of a loudspeaker has been propagated out of an enclosure from the back of the loudspeaker by acoustically coupling such sound energy to a passive radiator mounted on an exterior wall of the enclosure or to a port provided through an exterior wall of the enclosure. In either case, the known arrangements have not optimally used the acoustic space in the enclosure while providing a minimum amount of standing-wave motion and have not optimally controlled the direction of acoustic energy travel while preventing establishment of internal or structural resonances. Such known arrangements have moreover been deficient in providing a compression capability for producing an acoustic restoring force to dampen mechanical overshooting of a loudspeaker at low frequencies and extending low frequency response, as well as in minimizing harmonic distortion at fundamental frequencies.

SUMMARY OF THE INVENTION

It is the principal aim of the invention to provide a loudspeaker apparatus which overcomes the aforementioned shortcomings and deficiencies of the known arrangements.

According to the invention, there is provided a loudspeaker apparatus having a speaker enclosure in which sound energy emanating from the back of the loudspeaker is initially directed through a first sound wave compression zone in a first direction and then substantially equally into each of two second sound wave compression zones in respective second directions opposed to the first direction, each second compression zone having either a passive radiator or a port therein for propagating the sound energy received by the zone out of the enclosure. Division of the interior volume of the enclosure into the first and second compression zones is preferably effected in conjunction with the exterior walls or shell of the enclosure by a spaced pair of virtually non-deformable, acoustically stiff divider members which extend alongside the loudspeaker from the speaker mounting baffle nearly to the back of the enclosure and in generally parallel relationship with the speaker axis and each other, and by a virtually non-deformable, acoustically stiff deflection piece at the enclosure back having two equal concave surfaces intersecting at a cusp lying on the speaker axis and pointing towards the speaker so as to intercept backwardly travelling sound energy and split it uniformly into halves, each of which proceeds by way of a straight transmission line portion into a respective one of the second compression zones. The speaker enclosure, for example, is capable of optimum reproduction and reinforcement of notes within an operational frequency range of from 25 to 500 Hz with an eight inch loudspeaker (driver) or within an operational frequency range of from 15 to 200 Hz with a twelve inch loudspeaker (driver). The operational frequency range depends on the loading of the driver, and such loading is controllable by selection of the ratio of the cross-sectional area of the driver to certain other cross-sectional areas within the enclosure.

BRIEF DESCRIPTION OF THE DRAWINGS

In order that the present invention may be more fully understood, it will now be described with reference to the accompanying drawings, in which:

FIG. 3 is a front elevational view of a speaker enclosure of another embodiment of the speaker apparatus according to the invention;

FIG. 4 is a partial view in section of characteristic structural details of the enclosure depicted in FIG. 3;

FIG. 5 is a front elevational view of the enclosure depicted in FIG. 1, but with the wrapping of grille material removed therefrom;

FIG. 6 is a partial view in section of characteristic structural details of the FIG. 1 enclosure;

DESCRIPTION OF THE PREFERRED EMBODIMENTS

Figure 1:
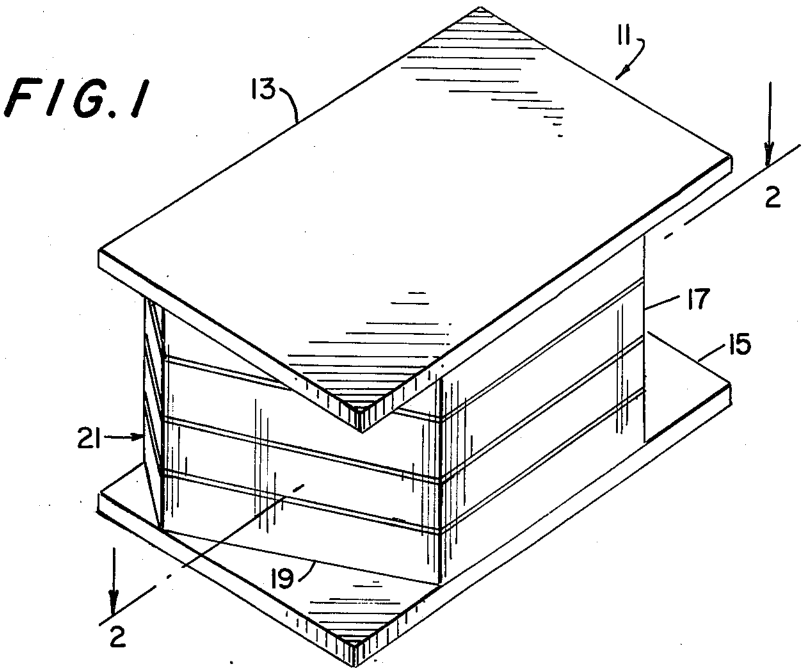
FIG. 1 is an isometric view of an enclosure of a speaker apparatus embodying the invention.

The speaker enclosure 11, with the orientation thereof depicted in FIG. 1, is seen to have a horizontal flat rectangular top 13 in spaced parallel relationship with an identical flat rectangular bottom 15. Vertically disposed between top 13 and bottom 15 along corresponding central portions of their longer sides at the front of enclosure 11 is a front panel 17. A first vertical side panel 19 of approximately the same width as that of front panel 17 extends rearwardly from the left vertical edge of front panel 17 at an oblique interior angle of approximately 112° and terminates at a vertical edge intersecting corresponding points of the left-hand shorter sides of top 13 and bottom 15. This vertical edge joins a vertical edge of a relatively narrow second vertical side panel 21 making an oblique interior angle of approximately 112° with side panel 19 and terminating at a vertical edge intersecting corresponding points of the longer sides of top 13 and bottom 15 at the rear of enclosure 11. Enclosure 11 is symmetrically constructed so that the half thereof to the left of an imaginary central vertical plane normal to front panel 17 is a mirror image of the half to the right of the plane, as seen best in FIG. 2 wherein the left half is indicated as the "A Side" and the right half as the "B Side". Thus, side panels 19 and 21 on the "A Side" were respectively duplicated by side panels 19 and 21 on the "B Side"; enclosure 11 is then completed by a vertical rear panel 23 (FIG. 2) extending between the rearmost vertical edges of the two side panels 21. As side panels 19 are larger than side panels 21, the latter constitute "minor side panels" and the former constitute "major side panels".

Top 13, bottom 15 and panels 17, 19, 21 and 23 are all made of a high compression type particle board. Top 13 and bottom 15 may have sheets of resinous veneer laminated thereto for additional surface strength and appearance. A length of textured foamed grille material may be removably wrapped around panels 17, 19, 21, 23 to give a decorative multi-tiered appearance to the panels, as indicated in FIG. 1, while concealing unattractive panel surfaces and panel-mounted components of enclosure 11.

Figure 2:
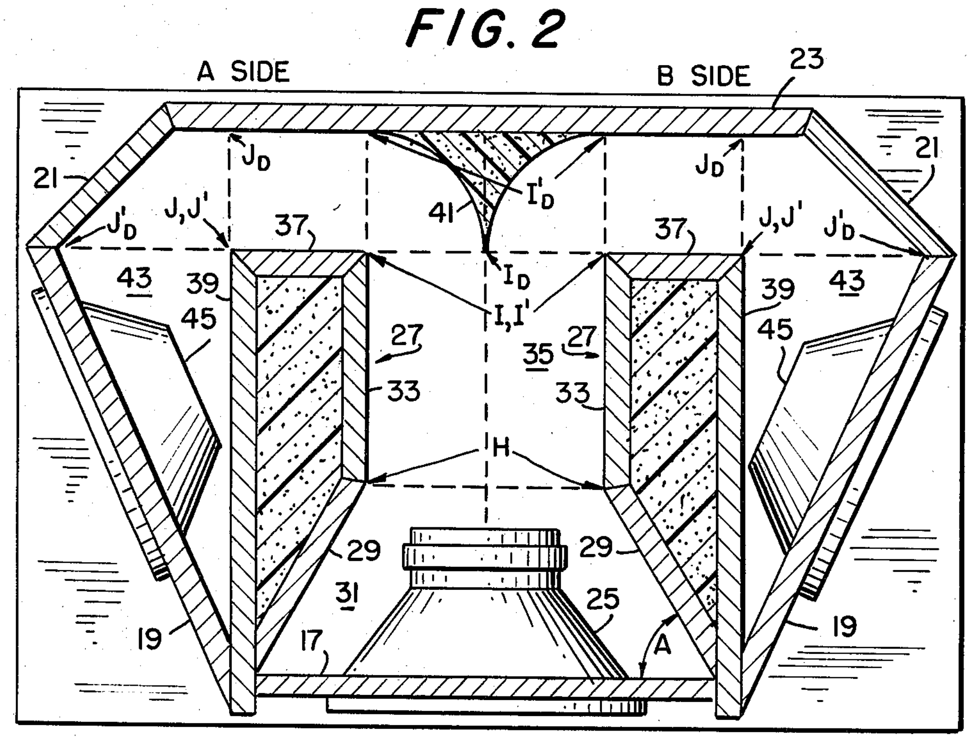
FIG. 2 is a cross-sectional view taken along the line 2—2 of FIG. 1.

With reference to FIGS. 2 and 5, a dynamic or moving-coil loudspeaker 25 is centrally mounted on front panel 17, whereby this panel serves as a baffle for the loudspeaker. As best seen in FIG. 2, on each side of loudspeaker 25 is a respective truncated rectangular prismatic divider 27. The opposed trapezoidal end surfaces of the dividers 27 are flush with the flat inner surfaces of top 13 and bottom 15, whereby dividers 27 extend over the full interior height of enclosure 11. The apices of dividers 27 are disposed at front panel 17, and the truncated surfaces 29 of the dividers define respective sides of an inwardly tapering primary compression zone 31 into which the cone of loudspeaker 25 projects. At edges H of dividers 27, truncated surfaces 29 join with the minor side surfaces 33 of the dividers to define between them a transmission duct 35 ending at an edge I,I′ of each divider. Narrow end surfaces 37 of dividers 27 proceed in parallel spaced relationship to vertical rear panel 23 from edges I,I′ to edges J,J′ of the dividers. At edges J,J′ they join with the major side surfaces 39 of dividers 27. Major side surfaces 39, which lie parallel to minor side surfaces 33, meet with truncated surfaces 29 at the apices of dividers 27 and extend therefrom to terminations only slightly beyond the outer surface of front panel 17.

Surfaces 29, 33, 37 and 39 of each divider 27 are provided by respective pieces of rigid high compression particle board suitably joined together. The interior of each divider is filled with polyurethane foam which is constrained by the interior volume from expanding beyond 15% to 23% of its full extent. Thus, the foam exerts a substantial pressure on the interior surfaces of each divider 27 which is approximately three times the maximum acoustic pressure corresponding to a sound intensity of about 125 db that can be exerted by sound waves emanating from the back of an eight inch driver utilized as loudspeaker 25. Each divider is thereby rendered virtually non-deformable and acoustically stiff so as not to dissipate any of the acoustic energy produced by the speaker cone. It is noteworthy that this highly desirable effect is surprisingly obtained with a relatively minor addition of several ounces of the filler material to each divider 27.

A curvilinear deflection piece 41, outwardly resembling a broad-spined, elongated, hollow ground knife blade standing vertically on end, is mounted with its back against the interior surface of vertical rear panel 23 and with its sharp edge $I_D$ lying in the imaginary vertical plane of symmetry that divides enclosure 11 into its "A Side" and "B Side". Each concavely curved surface of deflection piece 41 is a like quarter of a cylindrical surface which merges tangentially with vertical rear panel 23 at a location $I_D'$. The opposed ends of deflection piece 41 are flush with the flat inner surfaces of top 13 and bottom 15, whereby, like dividers 27, the deflection piece extends over the full interior height of enclosure 11. Deflection piece 41 is made of sheet metal or other suitable rigid material and projects from rear panel 23 the same distance as the spacing between the rear panel and narrow end surface 37 of each divider 27. The purpose of deflection piece 41 is to uniformly separate the sound energy received from duct 35 into halves to be directed back towards the front of enclosure 11. The concavely curved deflection surfaces prevent a pressure squeeze from taking place between edges I,I′ and deflecton piece 41 and obviate the enlargement of the cross-sectional area of this region that would be required to produce a similar result if plane deflection surfaces were used instead. This is particularly significant, as such enlargement would cause gaps and eddies during the deflection process and reduce the effectiveness of sound transmission towards the front of enclosure 11. The curved surfaces are preferably coated with a material (not shown) not viscous to air flow, such as very tight weave rubber backed indoor-outdoor carpeting. The interior of deflection piece 41 is preferably filled with polyurethane foam in the same manner as the interior of each divider 27 and is accordingly rendered virtually non-deformable and acoustically stiff.

The sound energy deflected by the concavely curved surfaces of deflection piece 41 travels through the straight transmission line portions bounded by vertical rear panel 23 and narrow end surfaces 37 of dividers 27 and undergoes a secondary deflection about each edge J,J′ by impinging the inner surface of each of the smaller vertical side panels 21 which then unload the energy into secondary compression zones 43 located between the larger vertical side panels 19 and major side surfaces 39 of dividers 27.

With reference to FIGS. 2, 5 and 6, a conventional passive sound radiator 45 is centrally mounted on each of the larger vertical side panels 19 with its cone projecting into a respective one of secondary compression zones 43. Uniform acoustic driving forces are applied to the relatively large diameter pistons of passive radiators 45 by virtue of the converging of vertical side panels 19 of enclosure 11 with major side surfaces 39 of divider 27 as sound energy travels deeper into secondary compression zone 43. The action is somewhat analogous to that which takes place in a water sprinkler system for fire protection, wherein uniform pressure at the beginning and end of the sprinkler line is maintained by progressively decreasing the water supply pipe diameter until the end of the line is reached.

The angle A (FIG. 2) which truncated surface 29 of each divider 27 makes with front panel 17 is selected according to the size of the loudspeaker utilized. Thus, for an eight inch driver, angle A is typically about 30° and, for a fifteen inch driver, about 40°. For optimum performance and small enclosure size, a given ratio of the effective surface area of the driver cone to the cross-sectional area of transmission duct 35 must be established. This ratio, in the present example, is 1:2 and is achieved with an eight inch driver of 33.2 square inches effective cone surface area and a transmission duct of 66.54 square inches cross-sectional area (11.375 inches high by 5.85 inches wide at edges H,H). The eight inch driver, due to the ability of its relatively small cone to operate accurately at higher frequencies, enables the present example to achieve its desired aim of reproducing notes up to 500 Hertz. It is moreover desired not to overreact with the cone, but still reproduce notes down to 25 Hertz. The 1:2 ratio is most efficient for this purpose. It should be noted, however, that for other desired operational frequency ranges different ratios may be selected. As the cross-sectional area of transmission duct 35 is decreased relative to driver cone surface area, the amount of air displaced in duct 35 by a given displacement of the driver cone will be increased, thereby causing more sound energy to be utilized in the acoustic path portions beyond duct 35 of speaker enclosure 11. Since low frequencies are enhanced by the additional load and high frequencies are attenuated by the increased mass reactance on the driver cone, it is evident that changes in operational frequency range may be effected by changing the 1:2 ratio of driver cone surface area to transmission duct cross-sectional area. Thus, in using a twelve inch driver for a desired operational frequency range of from 15 to 200 Hertz, the effective load on the larger driver for this range will be increased by changing the ratio to 1:1.5. This results in a 33.3% increase in air displacement through transmission duct 35 over that obtained with the 1:2 ratio for a given cone displacement.

Insofar as areal ratio considerations are concerned, the present example preferably also takes into account the combined cone surface areas of the two passive radiators 45. The previously discussed 1:2 areal ratio thus becomes 1:2:2 which represents the ratio of driver cone surface area to transmission duct cross-sectional area to combined passive cone surface area. Hereinafter, an embodiment of the invention in which ports are used instead of passive radiators will be described in connection with FIGS. 3 and 4. In that embodiment, the preferred three-part areal ratio is 1:2:0.6 which represents the ratio of driver cone surface area to transmission duct cross-sectional area to combined port area. The port area on each side of enclosure 11 is 9.96 square inches or 0.3×33.2 square inches.

For a further explanation of the propagation of sound energy through enclosure 11, reference will now be made to FIG. 11 which in effect unfolds the symmetrical acoustic paths depicted in FIG. 2. Each acoustic path starts in FIG. 11 at the left with primary compression zone 31 and ends at the right with secondary compression zone 43, For simplicity's sake, only the acoustic path of the "A Side" of enclosure 11 is completely plotted. In the coordinate system of FIG. 11, the width of the unfolded acoustic path (transmission line) is read in inches from the ordinate, while the length thereof is read in inches from the abscissa. As the height of the transmission line is constant, it will suffice hereinafter to refer only to the width and length components in discussing volume displacement.

Figure 11:
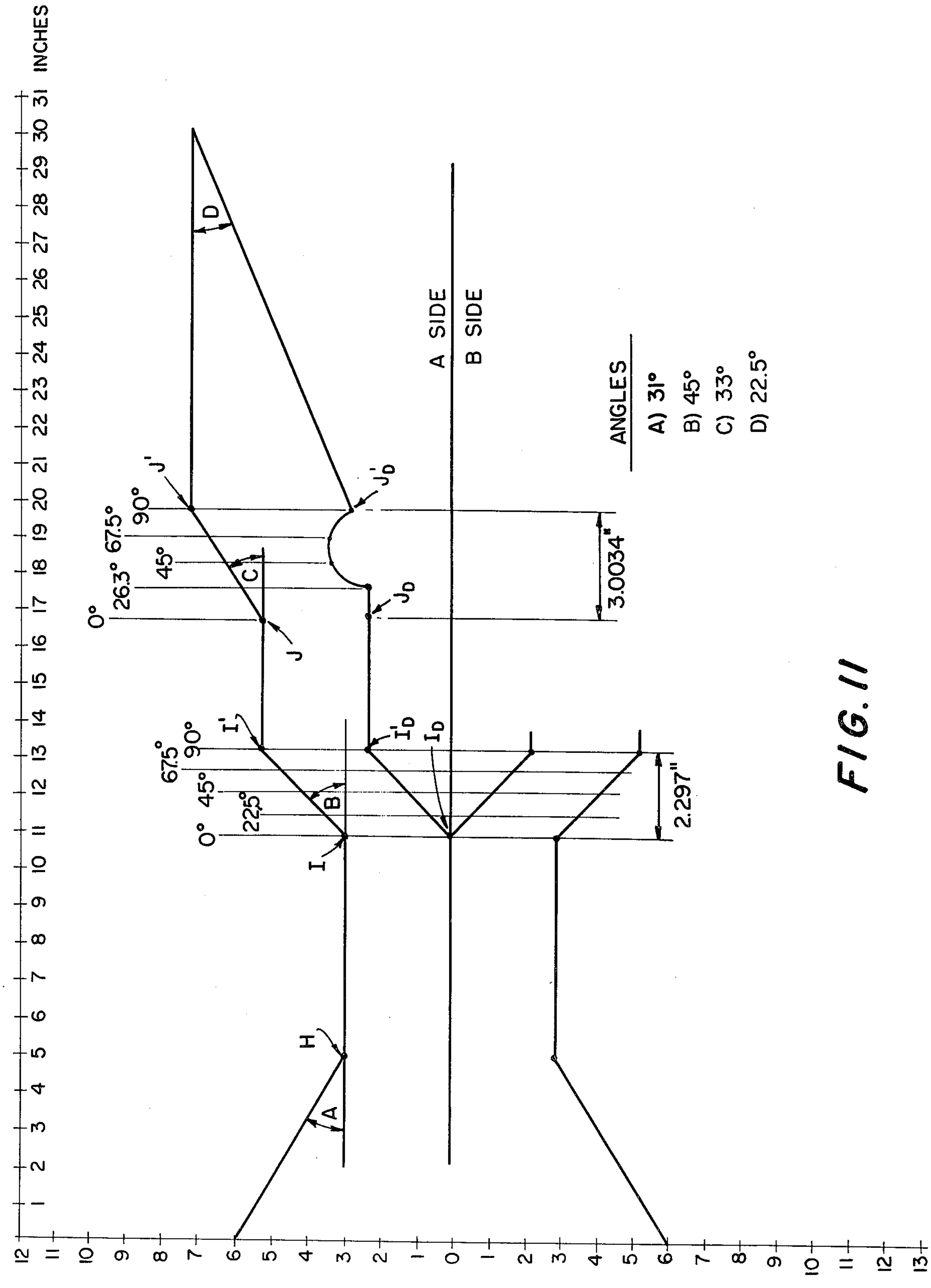
FIG. 11 is a graphically plotted linear transformation of one of the symmetrical acoustic paths travelled by sound energy in the enclosure of FIG. 2.

At point I of FIG. 11, the linear transformation of the angular deflections in FIG. 2 begins. Thus, the circuit quadrant in FIG. 2, centered at edge I,I' and having terminal edges $I_D$ and $I_D'$, is transformed in FIG. 11 into a linear channel bounded by two lines, one of which is theoretically constructed, i.e. line I—I'. Line I—I' may be though of as representing the path of a particle of air very close to edge I,I' (FIG. 2), while the inclination of line I—I' with the horizontal at angle B represents the average direction of all particles passing through the quadrant. The other boundary line of the linear channel, i.e. line $I_D$—$I_D'$ is plotted by dropping vertically from each of a plurality of reference points along line I—I' a distance equal to the radius of the circular quadrant, the reference points being equally spaced along line I—I' and representing successive 22.5° increments of the 90° total deflection effected by the curvilinear deflection piece 41.

The length of line I—I', hence the length of line $I_D$—$I_D'$, is that of the hypotenuse of a right isosceles triangle, each remaining side of which equals the effective displacement the sound energy undergoes within the circular quadrant in FIG. 2. In the embodiment shown, the radius of the arc of deflection piece 41 is 2.925 inches and, therefore, the circumferential length of the arc is $$\frac{27^\circ \times 2.925}{4} = 4.594 \text{ inches.}$$

Half of this circumferential length, i.e. 2.297 inches, is the effective displacement the sound energy undergoes within the circular quadrant. The length of line I—I' in FIG. 11 is accordingly plotted so that its projected length along the horizontal (abscissa) is 2.297 inches.

In FIG. 11, the parallel lines I'-J and $I_D'$-$J_D$ indicate the straight transmission line portion bounded, in FIG. 2, by vertical rear panel 23 and narrow end surface 37 of the left-hand divider 27. Secondary deflection begins at point J of FIG. 11, and line J—J' may be thought of as representing the path of a particle of air very close to the edge, J,J' (FIG. 2), while the inclination of line J—J' with the horizontal at angle C represents the average direction of all particles passing through the secondary deflection channel. The other boundary line of the secondary deflection channel, i.e. irregular line $J_D$—$J_D'$, is plotted by dropping vertically from each of a plurality of reference points along line J—J' a distance equal to the distance from edge J,J' (FIG. 2) to the enclosure interior surfaces 23,21 (FIG. 2). The reference points along line J—J' (FIG. 11) define successive stages of the 0°-90° secondary deflection of the sound energy. As shown in FIG. 11, the first stage is from 0° to 26.3°, which represents the angular displacement in FIG. 2 from $J_D$ to the intersection of vertical rear panel 23 and second vertical side panel 21, with reference to edge J,J'. The next stage is from 26.3° to 45°, at the start of which the lower boundary line $J_D$—$J_D'$ changes from a divergent linear relationship with the upper boundary line J—J' to an arcuately convergent relationship which becomes arcuately divergent at the start of the stage from 45° to 67.5° and continues through the stage from 67.5° to 90°.

In the embodiment shown, vertical rear panel 23 extends 1.5 inches beyond point $J_D$ (FIG. 2) and, owing to the 45° disposition of second vertical side panel 21, causes the distance from edge J,J' to $J_D'$ to be 4.5 inches. It is seen quite clearly in FIG. 11 how the deflection effected by second vertical side panel 21 unloads the sound energy beyond 45° of rotation, the maximum distance between points J' and $J_D'$, i.e. 4.5 inches, being achieved at the full 90° of rotation. With deflection completed, the sound energy flows into secondary compression zone 43 (FIG. 2) defined in FIG. 11 by the upper horizontal line extending from point J' and the convergent lower line extending from point $J_D'$, the two lines having an included angle D and intersecting at a point corresponding to the intersection in FIG. 2 of first vertical side panel 19 and major side surface 39 of divider 27.

The dual compression nature of enclosure 11 stemming from the provision of primary compression zone 31 and secondary compression zone 43, in association with their interconnecting transmission line portions, results in each passive radiator 45 being modulated in its own volume without the distortion caused by adjacent standing waves which typically exists in low frequency (i.e. below 500 Hz) enclosures having a passive radiator and one or more drivers sharing one volume. The dual compression nature of enclosure 11 moreover results in undesired transmission line resonances being reduced, since the transmission line connection between the primary and secondary compression zones 31,43 includes deflection portions and resonances can only occur in the straight portions, the longest of which is the 5.85 inches long transmission duct 35 (FIG. 2). Frequencies above 500 Hertz are unaffected by the transmission line, so that the only concern is adverse resonance at lower frequencies. However, resonant frequencies of the straight portions are all far higher in value than the 500 Hz upper reproduction frequency for which enclosure 11 is designed.

Figure 7A:
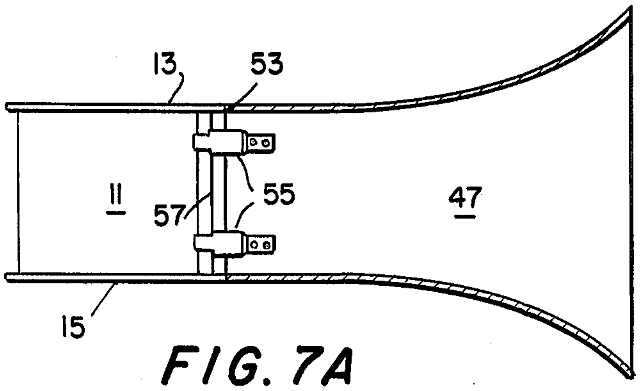
FIGS. 7A and 7B illustrate respectively in side and front elevational views the affixation of an exponential horn to the enclosure of FIGS. 3 and 4.
Figure 7B:
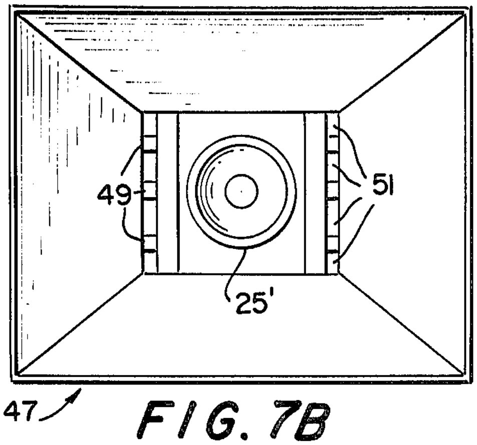

A further feature of the dual compression nature of enclosure 11 is that it facilitates a modification of the enclosure by which direct coupling of the sound energy to an externally mounted exponential horn can be made. Such a modification is depicted in FIGS. 3 and 4, while an exponential horn 47 for use with the modification is depicted in FIGS. 7A and 7B. In contrast to the earlier described structure of FIG. 6, the structure of FIGS. 3 and 4 has a recessed front panel 17′ (loudspeaker baffle) bridging the truncated surfaces 29′ of dividers 27′. Moreover, neither major side surface 39′ of the dividers has an extension beyond its junction with the truncated surface 29′; and neither of the first vertical side panels 19′ meets the major side surfaces 39′ of the dividers. As to the latter difference, the front edge of each panel 19′ is instead spaced a short distance from the front edge of its associated surface 39′ and this space is horizontally bridged by three vertically spaced dowels 49 which, as seen in FIG. 3, leaves a set of four ports 51 at the front of the enclosure on both sides thereof from which the sound energy leaves the enclosure from the respective secondary compression zones 43′.

The dotted lines in FIG. 3 indicate the lip 53 of exponential horn 47 when the horn is secured to the enclosure front for coupling into the horn of sound energy emanating from the front and back of loudspeaker 25′, preferably a fifteen inch driver. The securing of horn 47 may be effected by any suitable means, one being the clamps 55 generally indicated in FIG. 7A which clamp the horn securely to stout support dowels 57 vertically affixed between top 13 and bottom 15 of the enclosure in the available space externally adjacent the front edge of each first vertical side panel 19′. In the example shown, horn 47 is six feet long and its flared end is six and a half feet in width and five feet, five inches in height. Such a horn can be manufactured simply, as no design factor of its own requires it to provide compression. Exponential expansion may accordingly begin at its lip 53.

While the use of horn 47 with the modified enclosure is generally to be desired in large auditoriums, discotheques and the like in order to obtain projectively of sound energy, especially by stacking several of the horn-equipped enclosures aimed in different directions, it will be understood that the modified enclosure can readily be used without a horn. In that case, the forwardly driven sound energy will enter the room directly from loudspeaker 25′ and the backwardly driven sound energy will enter the room directly from the eight ports 51.

Figure 8:
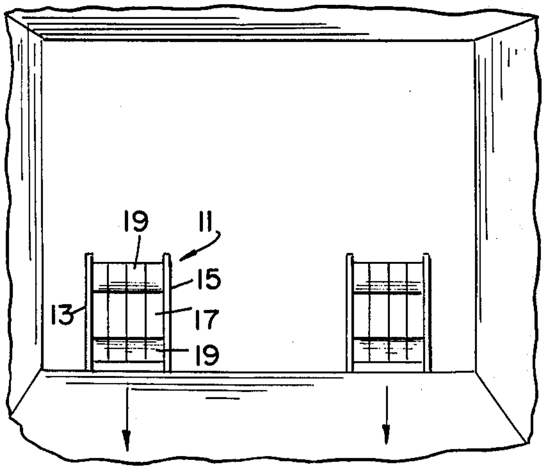
FIGS. 8, 9 and 10 illustrate three placements of speaker apparatus pairs according to the invention in a room for stereophonic listening.
Figure 9:
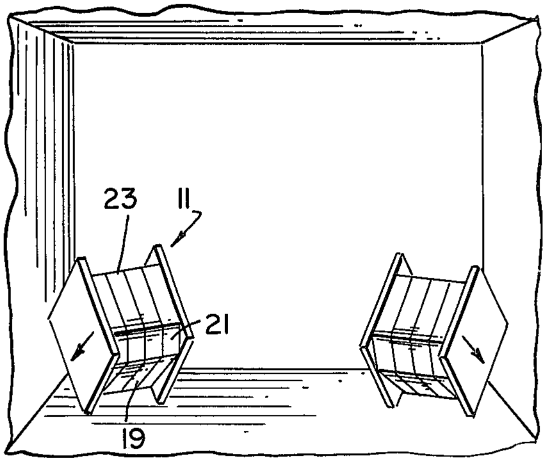
Figure 10:
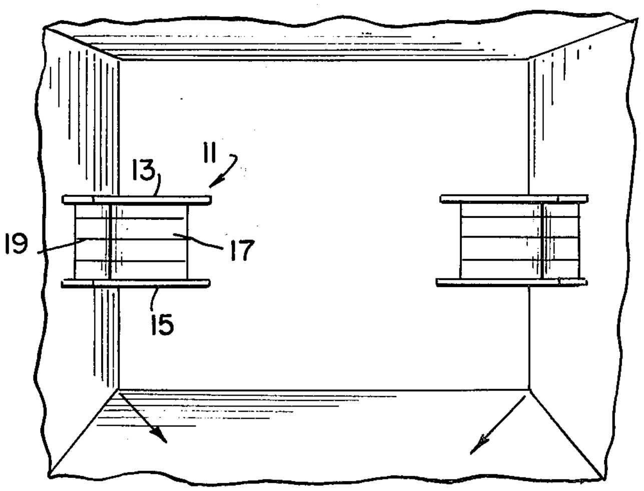

For optimum performance in a home environment, however, the earlier described sealed enclosure embodiment of FIGS. 1 and 2 having passive radiators 45 instead of ports 51 is preferred, as it offers a unique way of developing acoustic power in a room. FIGS. 8, 9 and 10 show three of an infinite number of possible placements of a pair of enclosures 11 in a room for stereophonic listening. In FIG. 8, enclosures 11 are oriented so as to stand on corresponding short side edges of their tops 13 and bottoms 15 with their loudspeakers 25 facing the listener. The passive radiators 45 on one side point vertically forward towards the ceiling and the passive radiators 45 on the other side point vertically forward towards the floor. Thus oriented, enclosures 11 displace a low frequency field directly into the room (using the front wall and the floor for propagation).

In FIG. 9, enclosures 11 are oriented so that their loudspeakers 25 are aimed directly into the respective corners of the room. Most of the low frequency wavefront is thus generated directly off the walls and floor. The corner orientation of each enclosure 11 defines an amount of air in the corner that must be moved for the audible field to reach the listener. Projection of the sound into the corner thus increases the sound level pressure from under 0.5 db to 6 db and over, depending on the size of the room, relative to conventional sound projection forwardly into the room. More elaborate enclosures have heretofore been designed for corner projection, but they are bulky and are without control of their drivers by circuits terminated by passive radiators for proper transfer of energy to the load imposed by the corner.

In FIG. 10, each enclosure 11 is corner mounted intermediate the ceiling and floor of the room with its top 13 and bottom 15 parallel to the ceiling and floor and with its loudspeaker 25 facing forwardly into the room at a 45° angle to each of the corner walls. Thus oriented, enclosure 11 works with an inertial load at the corner which is greater than that of the orientation shown in FIG. 8 but not as great as that shown in FIG. 9.

The passive radiator embodiment of enclosure 11 is designed so that the critical resonant frequency is the driver resonant frequency. The passive radiator resonant frequency is then selected to be just half of the critical resonant frequency. More specifically, the critical resonant frequency is 32 Hertz and the passive radiator resonant frequency is 16 Hertz. By virtue of this resonant frequency relationship, the first harmonic of the passive radiator resonant frequency is caused to coincide with the critical resonant frequency. This results in an enhancement of critical damping of the driver, as the passive radiators are then more purely out of phase with the driver, and the transfer of low frequency sound from the back of the driver to the passive radiators will accordingly occur at maximum efficiency. In this way, the low frequency response of enclosure 11 is extended nearly half an octave below the critical frequency to 24.5 Hertz.

Proper design of any phase inverter speaker system should take into account a small ripple factor at the critical frequency of the driver. This ripple factor is taken into account in the present invention by a low frequency acoustical crossover element formed by the driver-passive radiator coupling which provides uniform response by the passive radiators. Heretofore, systems utilizing passive radiators have shown, due to the ripple factor, a sharp decrease in the relative output of the passive radiators and have accordingly required electronic equalization to provide uniform response at and below the critical frequency.

With any given size of driver, optimum acoustic coupling of the driver to the enclosure is achieved for a given critical frequency of the driver if the driver provides the force required to displace the mass of air in the enclosure in addition to the force required to displace the passive radiator diaphragms at their resonant frequencies. In the present example, optimum acoustic coupling of an eight inch driver is achieved for the critical frequency (driver resonant frequency) of 32 Hertz by the displacement of a 40.5 gram mass of air in the enclosure combined with the displacement of the passive radiator diaphragms, the latter displacement requiring 231 grams, so that the total mass load on the driver diaphragm is 271.5 grams. These loading values should not vary more than ±10%.

Sound pressure level measured one meter on axis to driver 25 is over 110 db with an rms sine wave input of 55 watts. The enclosure equipped with passive radiators fits into a rectangular container measuring 16.25 inches×13.5 inches×24.25 inches and weighs 43 pounds. The enclosure provided with ports fits into a like rectangular container, but weighs somewhat less.

I claim:

1. Loudspeaker apparatus comprising:

(A) an enclosure having parallel top and bottom panels, between which are perpendicularly disposed parallel front and back panels, as well as an opposed pair of identical major side panels which extend rearwardly from the front of said enclosure at equal first obtuse interior angles with respect to said front panel and an opposed pair of identical minor side panels which extend forwardly from the rear of said enclosure at equal second obtuse interior angles with respect to said back panel, said minor side panels respectively having edge-to-edge junctions with said major side panels;

(B) an electrically drivable loudspeaker within said enclosure and centrally mounted on said front panel to project forwardly traveling sound energy directly out of said enclosure when said loudspeaker is electrically driven;

(C) a pair of passive radiators within said enclosure, each being centrally mounted on a respective one of said major side panels to project sound energy directly out of said enclosure when driven by received sound energy; and (D) means within said enclosure for dividing backwardly traveling sound energy from said loudspeaker into two substantially equal portions and channeling each portion in uniform driving relation to a respective one of said passive radiators, said dividing and channeling means including:

(a) an elongated deflection member extending perpendicularly between said top and bottom panels, said deflection member having, coextensive with its length, a mounting surface disposed against the back panel and two concave arcuate deflection surfaces converging from the back panel toward one another about a vertical plane of symmetry of said enclosure and intersecting to define a linear apex spaced from said loudspeaker and normal to the speaker axis; and (b) a pair of prismatic divider members extending perpendicularly between said top and bottom panels, each divider member being spaced from said deflection member and spaced from and disposed between said loudspeaker and a respective one of said passive radiators, whereby said backwardly traveling sound energy from said loudspeaker is initially channeled between said divider members to said convergent concave arcuate deflection surfaces of said elongated deflection member and divided thereby into said two substantially equal portions, whereafter each said portion is channeled between a respective one of said prismatic divider members and, successively, said back panel, a respective one of said minor side panels and a respective one of said major side panels.

2. Loudspeaker apparatus according to claim 1 wherein each said prismatic divider member is formed as a truncated rectangular prism having opposed trapezoidal end surfaces flush with said top and bottom panels and having apices disposed at said front panel, the respective truncated surfaces of said pair of divider members defining respective sides of an inwardly tapering primary compression zone into which a cone of said loudspeaker projects.

3. Loudspeaker apparatus according to claim 2, wherein each said prismatic divider member is internally filled with polyurethane foam which is constrained by the interior volume of the member from expanding beyond 15% to 23% of its full extent, whereby the foam exerts a substantial pressure on the interior surfaces of each divider member so as to render the divider member virtually non-deformable and acoustically stiff.

4. Loudspeaker apparatus according to claim 2, wherein each said prismatic divider member consists essentially of dense polyurethane foam.

5. Loudspeaker apparatus comprising:

(A) an enclosure having first, second, third, fourth, fifth and sixth vertical exterior walls;

(B) a loudspeaker mounted to face outwardly on said first vertical exterior wall for propagating sound energy directly out of the enclosure from the front of said loudspeaker;

(C) a first passive radiator mounted to face outwardly on said second vertical exterior wall; and (D) a second passive radiator mounted to face outwardly on said third vertical exterior wall;

(E) said second and third vertical exterior walls having corresponding first vertical side edges thereof joined respectively to opposed vertical side edges of said first vertical exterior wall and extending rearwardly therefrom in divergent angular relationship with one another;

(F) said second and third vertical exterior walls having corresponding second vertical side edges thereof joined respectively to corresponding first vertical side edges of said fourth and fifth vertical exterior walls;

(G) said fourth and fifth vertical exterior walls having corresponding second vertical side edges thereof joined respectively to opposed vertical side edges of said sixth vertical exterior wall and extending forwardly therefrom in divergent angular relationship with one another;

(H) the interior volume of said enclosure being provided with means for guiding backwardly traveling sound energy emanating from the back of said loudspeaker to said first and second passive radiators through a first compression zone in a transmission path portion common to both passive radiators and thence equally, via respective other transmission path portions, into a second compression zone occupied by said first passive radiator and a third compression zone occupied by said second passive radiator, so that each passive radiator will be modulated in its own volume by said backwardly traveling sound energy.

6. Loudspeaker apparatus according to claim 5, wherein said loudspeaker has a resonant frequency twice the value of the resonant frequency of each said passive radiator.

7. Loudspeaker apparatus according to claim 6, wherein said loudspeaker has a resonant frequency of 32 Hertz.

8. Loudspeaker apparatus according to claim 5, wherein said first compression zone is defined by said first vertical exterior wall and by two vertical interior walls extending at equal acute angles from said first vertical exterior wall so as to converge toward said sixth vertical exterior wall.

9. Loudspeaker apparatus according to claim 8, wherein said second compression zone is defined by said second vertical exterior wall and by a third vertical interior wall connected at an acute angle therewith near its said first vertical side edge, said third compression zone being defined by said third vertical exterior wall and by a fourth vertical interior wall connected at an acute angle therewith near its said first vertical side edge.

10. Loudspeaker apparatus according to claim 9, wherein one of the vertical interior walls defining the first compression zone is part of a first divider member which includes said third vertical interior wall, and wherein the other vertical interior wall defining said first compression zone is part of a second divider member which includes said fourth vertical interior wall.

11. Loudspeaker apparatus according to claim 8, wherein the ratio of the effective surface area of the loudspeaker to the cross-sectional area of the narrow end of said first compression zone is 1:2 for an eight inch loudspeaker and 1:1.5 for a twelve inch loudspeaker.

12. Loudspeaker apparatus according to claim 5, wherein said guiding means including an elongated deflection member extending perpendicularly between top and bottom walls of said enclosure, said elongated member having, coextensive with its length two concave arcuate deflection surfaces converging toward one another from the inner surface of said sixth vertical exterior wall about a vertical plane of symmetry of said enclosure and intersecting to define a linear apex spaced from said loudspeaker and normal to the speaker axis.

* * * * *